(12) United States Patent
Yoshimitsu

(10) Patent No.: US 11,496,131 B2
(45) Date of Patent: Nov. 8, 2022

(54) SWITCHING ELEMENT DRIVE DEVICE

(71) Applicant: Yazaki Corporation, Tokyo (JP)

(72) Inventor: Shota Yoshimitsu, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/372,679

(22) Filed: Jul. 12, 2021

(65) Prior Publication Data

US 2022/0052684 A1    Feb. 17, 2022

(30) Foreign Application Priority Data

Aug. 17, 2020 (JP) .............................. JP2020-137453

(51) Int. Cl.
| | |
|---|---|
| H02M 1/38 | (2007.01) |
| H02M 3/158 | (2006.01) |
| G05F 1/10 | (2006.01) |
| G05F 3/02 | (2006.01) |
| H03K 17/687 | (2006.01) |
| H02M 1/08 | (2006.01) |

(52) U.S. Cl.
CPC ............ *H03K 17/687* (2013.01); *H02M 1/08* (2013.01)

(58) Field of Classification Search
None
See application file for complete search history.

(56) References Cited

U.S. PATENT DOCUMENTS

| | | | | |
|---|---|---|---|---|
| 6,028,755 A * | 2/2000 | Saeki | ................... | H02H 7/1213 361/91.1 |
| 6,185,082 B1 * | 2/2001 | Yang | ...................... | H02M 1/32 361/93.7 |
| 6,194,880 B1 * | 2/2001 | Fraidlin | .............. | H02M 3/1588 323/222 |
| 6,301,133 B1 * | 10/2001 | Cuadra | ................... | H02J 1/102 363/65 |
| 7,129,663 B2 * | 10/2006 | Suzuki | ................ | H02M 3/1588 318/504 |
| 8,179,106 B2 * | 5/2012 | Tokura | .................. | H02M 3/158 323/283 |
| 8,760,832 B2 * | 6/2014 | Ueta | ...................... | H02H 3/087 361/79 |
| 2012/0001608 A1 | 1/2012 | Sato et al. | | |
| 2016/0211767 A1 | 7/2016 | Hotta | | |
| 2017/0021733 A1 | 1/2017 | Kondou et al. | | |
| 2020/0041356 A1 | 2/2020 | Neidorff et al. | | |

FOREIGN PATENT DOCUMENTS

JP          2013-005474 A       1/2013

* cited by examiner

*Primary Examiner* — Kenneth B Wells
(74) *Attorney, Agent, or Firm* — Sughrue Mion, PLLC

(57) ABSTRACT

A switching element drive device that reduces a switching loss while suppressing noise with an inexpensive configuration, is provided. The switching element drive device includes a current sensor configured to measure a load current flowing through a load, a voltage sensor configured to measure an input voltage inputted from a power supply, and a control part configured to output a command value of a gate drive voltage to a gate drive voltage supply part, the gate drive voltage supply part being configured to supply the gate drive voltage for driving a switching element disposed between the power supply and the load, wherein the control part is further configured to determine the command value of the gate drive voltage based on the load current and the input voltage.

4 Claims, 2 Drawing Sheets

SWITCHING ELEMENT DRIVE DEVICE

TECHNICAL FIELD

The present invention relates to a switching element drive device.

BACKGROUND

A voltage-driven switching element requires an increase in a switching speed to reduce switching loss; however, an increase in the switching speed generates noise due to a sudden change in the gate current. Thus, for example in Patent Document 1, the gate resistor value is switched when turning on/off based on a drain voltage to change the gate voltage, thereby reducing the switching loss while suppressing noise.

PRIOR ART DOCUMENT

Patent Document 1: JP 2013-5474 A

SUMMARY OF THE INVENTION

Problem to be Solved by the Invention

In the technique disclosed in Patent Document 1, however, the gate resistor value is switched by switching the hardware, and this causes an increase in cost.

In view of this, an object of the present invention is to provide a switching element drive device which can reduce a switching loss while suppressing noise with an inexpensive configuration.

Solution to the Problem

In order to achieve the above-described object, the present invention provides, in a first aspect, a switching element drive device including a current sensor configured to measure a load current flowing through a load, a voltage sensor configured to measure an input voltage inputted from a power supply, and a control part configured to output a command value of a gate drive voltage to a gate drive voltage supply part, the gate drive voltage supply part being configured to supply the gate drive voltage for driving a switching element disposed between the power supply and the load, wherein the control part is further configured to determine the command value of the gate drive voltage based on the load current and the input voltage.

The control part may be configured to determine the command value of the gate drive voltage such that the gate drive voltage increases as the load current increases.

The control part may be configured to determine the command value of the gate drive voltage such that the gate drive voltage increases as the input voltage increases.

The command value of the gate drive voltage may be a sum of a product of a first coefficient and the load current and a product of a second coefficient and the input voltage.

The first coefficient may be a function of the load current and/or the input voltage.

The second coefficient may be a function of the load current and/or the input voltage.

Advantageous Effect of the Invention

According to the present invention, it is possible to provide the switching element drive device which can reduce a switching loss while suppressing noise with an inexpensive configuration.

DETAILED DESCRIPTION OF THE EXEMPLARY EMBODIMENTS

Figure 1:
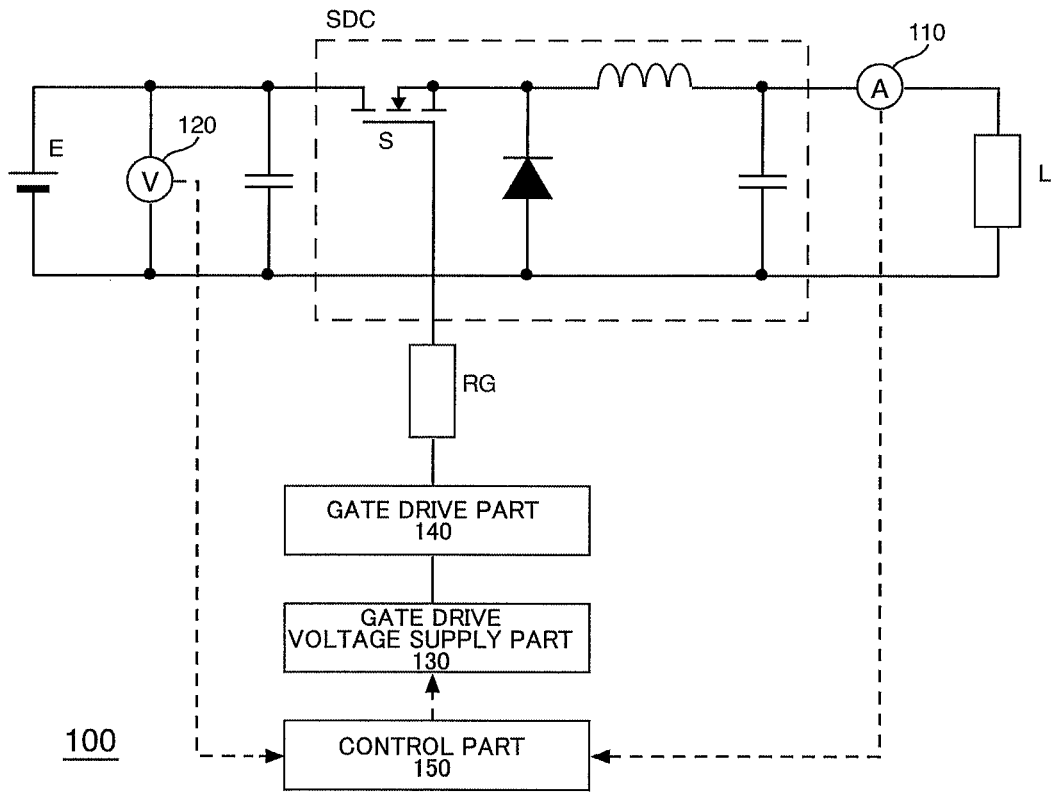
FIG. 1 shows a switching element drive device according to one embodiment of the present invention.

FIG. 1 shows a switching element drive device 100 according to one embodiment of the present invention. The switching element drive device 100 is configured to control driving of a switching element S. The switching element S is a voltage-driven switching element that is controlled by a voltage, and is for example a MOSFET (Metal-Oxide-Semiconductor Field-Effect Transistor). Although the switching element S is a switching element of a step-down chopper circuit SDC in FIG. 1, the switching element S may be a switching element of other types of switching power supply circuit.

The switching element drive device 100 includes a current sensor 110, a voltage sensor 120, a gate drive voltage supply part 130, a gate drive part 140, and a control part 150.

The current sensor 110 measures a current (load current Iout) flowing through a load L to which power is supplied from a power supply E.

The voltage sensor 120 measures a voltage (input voltage Vin) inputted from the power supply E.

The gate drive voltage supply part 130 supplies a voltage (gate drive voltage) to the gate drive part 140 for driving the gate. In this embodiment, the magnitude of the gate drive voltage is variable, and the gate drive voltage supply part 130 receives a command value of the gate drive voltage and supplies the gate drive voltage based on the command value to the gate drive part 140.

The gate drive part 140 drives the switching element S disposed between the power supply E and the load L. At a timing based on the gate signal, the gate drive part 140 supplies the gate drive voltage supplied from the gate drive voltage supply part 130 to the gate of the switching element to drive the switching element S. For example, a gate resistor RG is connected between the gate drive part 140 and the switching element S, and a current outputted from the gate drive part 140 flows from the gate drive part 140 through the gate resistor RG to the gate of the switching element S. The gate signal may be outputted by the control part 150, or may be outputted by another device separate from the control part 150.

Based on a load current measured by the current sensor 110 and an input voltage measured by the voltage sensor 120, the control part 150 determines the command value of the gate drive voltage and outputs this command value to the gate drive supply voltage part 140.

Thus, in this embodiment, the switching element S is driven by the gate drive voltage based on the input voltage and the load current, i.e., the gate drive voltage based on the power consumption of the load L. Consequently, in this embodiment, it is possible to reduce the switching loss while suppressing noise.

In this embodiment, for example, with respect to a light load, the gate drive voltage can be reduced and the time required to charge for the gate capacitance can be extended, and as a result, it is possible to suppress a sudden change in the drain-source voltage of the switching element S, and it is thus possible to reduce noise. On the other hand, with respect to a heavy load, the gate drive voltage can be increased and the time required to charge for the gate capacitance can be shortened, and as a result, it is possible to shorten a mirror time period of the switching element S, and it is thus possible to reduce the switching loss.

Further, in this embodiment, the control part 150 can be constituted of software. Thus, in this embodiment, there is no need for additional circuits and components, and consequently, it is possible to reduce the switching loss while suppressing noise with an inexpensive configuration.

For example, the control part 150 may be configured to determine the command value such that the gate drive voltage increases as the load current increases. When the input voltage Vin is constant, the power consumption of the load L increases as the load current Tout increases. Thus, by configuring as described above, the gate drive voltage can be reduced for the light load, and the gate drive voltage can be increased for the heavy load.

Further, the control part 150 may be configured to determine the command value of the gate drive voltage such that the gate drive voltage increases as the input voltage Vin increases. When the load current Tout is constant, the power consumption of the load L increases as the input voltage Vout increases. Thus, by configuring as described above, the gate drive voltage can be reduced for the light load, and the gate drive voltage can be increased for the heavy load.

The control part 150 may include a table in which the command values of the gate drive voltages for the input voltage Vin and the load current Tout are described, respectively, or may be configured to calculate the command value of the gate drive voltage based on the input voltage Vin and the load current Iout.

For example, the command value of the gate drive voltage may be the sum of the product of the first coefficient A and the load current Iout and the product of the second coefficient B and the input voltage Vin (AIout+BVin). At this time, the first coefficient A and the second coefficient B are set based on, for example, the electrical properties of the switching element, the gate resistor value, the input/output specifications of the switching power supply circuit, etc.

In this way, in this embodiment, simply rewriting the first and second coefficients A, B by a software enables correction to be made in accordance with the electrical properties of the switching elements, the gate resistor value, the input/output specifications of the switching power supply circuit, etc.

Further, the first coefficient A and the second coefficient B may be functions of the load current Iout, so that the first coefficient A and the second coefficient B may increase as the load current Iout increases. Further, the first coefficient A and the second coefficient B may be functions of the input voltage Vin, so that the first coefficient A and the second coefficient B may increase as the input voltage Vin increases.

Figure 2:
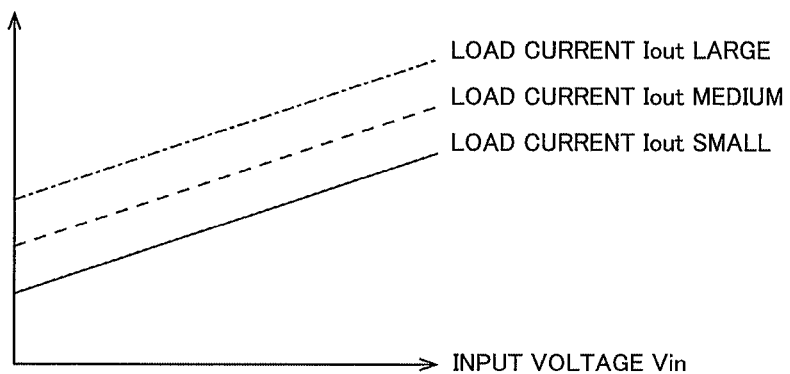
FIG. 2 is a diagram illustrating a relationship between a first coefficient A and load current Iout and input voltage Vin.
Figure 3:
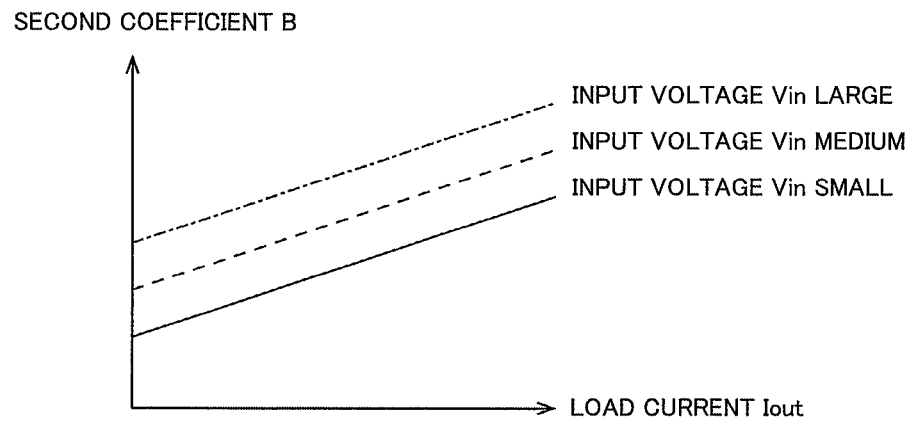
FIG. 3 is a diagram illustrating a relationship between a second coefficient B and the load current Iout and the input voltage Vin.

At this time, for example, the first coefficient A may increase as the input voltage Vin increases and increase as the load current Iout increases, as shown in FIG. 2. Further, the second coefficient B may increase as the input voltage Vin increases and increase as the load current Iout increases, as shown in FIG. 3.

The present invention has been described above with reference to a preferred embodiment of the present invention. While the present invention has been described herein with specific examples, various modifications and changes may be made thereto without departing from the spirit and scope of the present invention described in claims.

LIST OF REFERENCE SIGNS

100 switching element drive device
110 current sensor
120 voltage sensor
130 gate drive voltage supply part
140 gate drive part
150 control part

What is claimed is:

1. A switching element drive device comprising:
   a current sensor configured to measure a load current flowing through a load;
   a voltage sensor configured to measure an input voltage inputted from a power supply; and
   a control part configured to output a command value of a gate drive voltage to a gate drive voltage supply part, the gate drive voltage supply part being configured to supply the gate drive voltage for driving a switching element disposed between the power supply and the load, wherein
   the gate drive voltage supply part receives the command value of the gate drive voltage and supplies the gate drive voltage based on the command value to a gate drive part,
   the gate drive voltage is variable, and
   the control part is further configured to determine the command value of the gate drive voltage based on the load current and the input voltage,
   wherein the command value of the gate drive voltage is a sum of a product of a first coefficient and the load current and a product of a second coefficient and the input voltage.

2. The switching element drive device according to claim 1, wherein the control part is configured to determine the command value of the gate drive voltage such that the gate drive voltage increases as the load current increases.

3. The switching element drive device according to claim 1, wherein the control part is configured to determine the command value of the gate drive voltage such that the gate drive voltage increases as the input voltage increases.

4. The switching element drive device according to claim 1, wherein at least one of the first coefficient or the second coefficient is a function of the load current and/or the input voltage.

* * * * *